(12) United States Patent
Cowley et al.

(10) Patent No.: US 8,606,209 B2
(45) Date of Patent: Dec. 10, 2013

(54) APPARATUS AND METHODS FOR EFFICIENT IMPLEMENTATION OF TUNERS

(75) Inventors: Nicholas Cowley, Wroughton (GB); Isaac Ali, Bristol (GB); Bernard Arambepola, Enfield (GB)

(73) Assignee: Intel Corporation, Santa Clara, CA (US)

( * ) Notice: Subject to any disclaimer, the term of this patent is extended or adjusted under 35 U.S.C. 154(b) by 475 days.

(21) Appl. No.: 12/459,006

(22) Filed: Jun. 24, 2009

(65) Prior Publication Data

US 2010/0330932 A1 Dec. 30, 2010

(51) Int. Cl.
H04B 1/26 (2006.01)

(52) U.S. Cl.
USPC ............... 455/314; 455/76; 455/77; 455/313; 455/316; 455/323

(58) Field of Classification Search
USPC ............ 455/76, 77, 130, 150.1, 165.1, 178.1, 455/180.1, 183.1, 190.1, 207, 209, 213, 455/260, 264, 293, 313, 314, 316, 323
See application file for complete search history.

(56) References Cited

U.S. PATENT DOCUMENTS

| | | | |
|---|---|---|---|
| 5,995,815 A | 11/1999 | Blom | |
| 6,163,687 A * | 12/2000 | Scott et al. | 455/316 |
| 2006/0092334 A1 | 5/2006 | Wu | |
| 2006/0294540 A1 | 12/2006 | Perlman | |
| 2008/0049875 A1 | 2/2008 | Cowley et al. | |
| 2008/0284919 A1 | 11/2008 | Vorenkamp et al. | |
| 2010/0323635 A1 | 12/2010 | Steeper et al. | |
| 2010/0323636 A1 | 12/2010 | Cowley et al. | |

FOREIGN PATENT DOCUMENTS

| | | |
|---|---|---|
| CN | 1391361 A | 1/2003 |
| CN | 101931382 A | 12/2010 |
| EP | 2446616 A2 | 5/2012 |
| KR | 10-1997-0009318 A | 2/1997 |
| KR | 10-2002-0027240 A | 4/2002 |
| KR | 10-2012-0014029 A | 2/2012 |
| WO | 2011/005419 A2 | 1/2011 |
| WO | 2011/005419 A3 | 3/2011 |

OTHER PUBLICATIONS

International Search Report and Written Opinion received for PCT Patent Application No. PCT/US2010/038469, mailed on Jan. 21, 2011, 9 pages.
U.S. Appl. No. 12/456,930, filed Jun. 23, 2009, titled as "Apparatus and Methods for Implementing Multi-Channel Tuners".
U.S. Appl. No. 12/456,865, filed Jun. 23, 2009, titled as "Apparatus and Methods for Minimizing Phase Interaction Between Multiple Tuner Solutions".
International Preliminary report on Patentability and Written Opinion received for PCT Patent Application No. PCT/US2010/038469, mailed on Jan. 12, 2012, 6 pages.
Office Action and Search Report received for Chinese Patent Application No. 201010220355.3, mailed on Jul. 30, 2012, 6 pages of English Translation, 5 pages of Chinese Office Action and 2 pages of Chinese Search Report.
Office Action received for Korean Patent Application No. 10-2011-7029257, mailed on Nov. 28, 2012, 5 pages of English Translation and 6 pages of Korean Office Action.

* cited by examiner

*Primary Examiner* — Tuan Pham
(74) *Attorney, Agent, or Firm* — Forefront IP Lawgroup, PLLC

(57) ABSTRACT

Embodiments of systems and methods for the efficient implementation of tuners are generally described herein. Other embodiments may be described and claimed.

6 Claims, 6 Drawing Sheets

APPARATUS AND METHODS FOR EFFICIENT IMPLEMENTATION OF TUNERS

TECHNICAL FIELD

The present disclosure relates generally to the field of wired and wireless communications and more particularly to methods and related systems for implementing a fully integrated tuner.

BACKGROUND

Electronics devices for consumers and businesses include increasingly more diverse functionalities. Among the functions being provided in various electronic systems such as computer systems, stations, client devices, mobile internet devices, television receivers, satellite receivers, and set top boxes is the reception of television signals or similar multimedia streams and delivery over one or more channels using radio frequency signals.

Received radio frequency signals are typically converted or transformed by a tuner before the signals are passed to downstream components. The conversion process typically involves the use of a local oscillator to provide a signal frequency, or commutating frequency, that is mixed with the received signal to form a zero intermediate frequency signal and/or an intermediate frequency signal or commutating frequencies. In some architectures, conversion from received signal to output may involve two frequency conversion stages. In such architectures, generation of two or more commutating frequencies requiring two or more local oscillators (LO)\phase lock loops (PLL) in one or more tuners typically results in additional cost, space, and may lead to LO interaction resulting in degraded channel quality.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
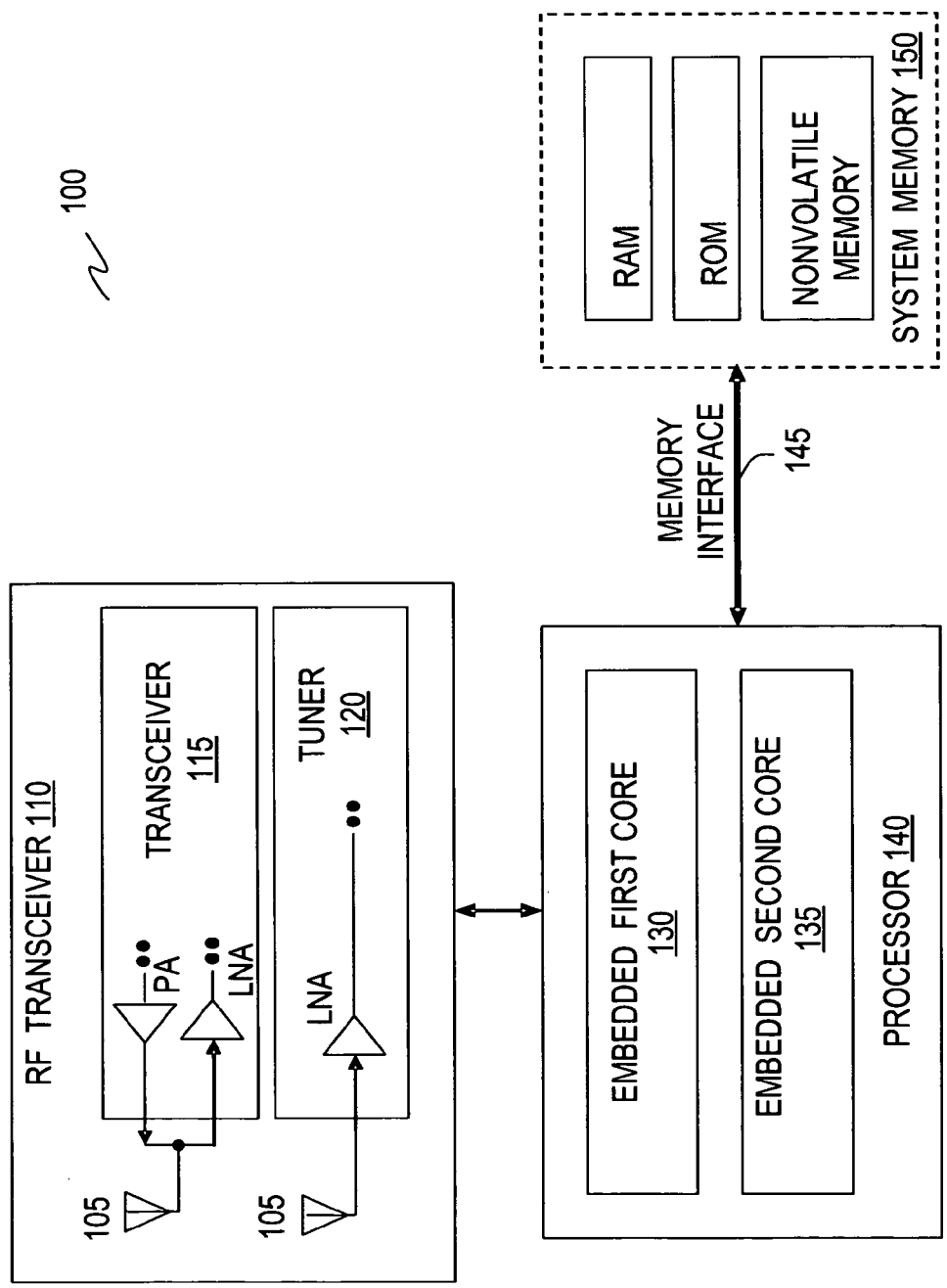
FIG. 1 is a block diagram of an electronic system in accordance with some embodiments of the invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details for the efficient implementation of tuners are set forth to provide a thorough understanding of the invention. However, it will be understood by those skilled in the art that the present invention may be practiced without these specific details. In other instances, well-known methods, procedures, components and circuits have not been described in detail so as not to obscure the present invention.

It would be an advance in the art to provide an apparatus and methods for an efficient implementation of a tuner, wherein the tuner is configured to deliver multiple commutating frequencies from a common source while avoiding intra-system interaction that can negatively affect performance. Performance of electronic devices having a single tuner capable of delivering two or more commutating frequencies can degrade when the commutating frequencies are tuned close to or equal to the same or harmonically related frequencies, resulting in impairment of the service. Typically, it is found that in such circumstances that multiple local oscillators or phase lock loops associated with the tuner can injection lock or "pull" each other when the local oscillators are placed in close physical proximity to one another.

Electronic systems requiring more than one source (e.g. a local oscillator) in the same tuner may be configured so that each local oscillator is independently isolated through application of electromagnetic coupling isolation. Additionally in other solutions, design techniques may be applied to minimize other coupling sources such as common ground or supply loops. Application of multiple tuners incorporating such techniques require additional space and expense which is a burden, particularly in mobile devices designed with small form factors or in low cost applications. It would be advantageous to employ a system and methods to avoid the use of multiple local oscillators in applications requiring multiple commutating frequencies. Use of a single local oscillator in applications requiring multiple commutating frequencies would be especially useful in instances where all or part of the components of the tuners are located on a monolithic integrated circuit or disposed on a common substrate.

Some embodiments of the invention may be used in conjunction with various devices and systems, for example, a station, a client, a Personal Computer (PC), a set-top box, a television device, a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a non-mobile or non-portable device, a wireless communication station, a wireless communication device, a wireless Access Point (AP), a wired or wireless router, a wired or wireless modem, a wired or wireless network, a Local Area Network (LAN), a Wireless LAN (WLAN), a Metropolitan Area Network (MAN), a Wireless MAN (WMAN), a Wide Area Network (WAN), a Wireless WAN (WWAN), a Personal Area Network (PAN), a Wireless PAN (WPAN), devices and/or networks operating in accordance with existing IEEE 802.11, 802.11a, 802.11b, 802.11g, 802.11n, 802.16, 802.16d, 802.16e standards and/or future versions and/or derivatives and/or Long Term Evolution (LTE) of the above standards, units and/or devices which are part of the above networks, one way and/or two-way radio communication systems, cellular radio-telephone communication systems, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device (e.g., BlackBerry, Palm Treo), a Wireless Application Protocol (WAP) device, or the like.

Some embodiments of the invention may be used in conjunction with one or more types of wireless communication signals and/or systems, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), extended GPRS, Code-Division Multiple Access (CDMA), Wideband CDMA (WCDMA), CDMA 2000, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, or the like. Embodiments of the invention may be used in various other devices, systems and/or networks.

The terms "interference" or "noise" as used herein include, for example, random or non-random disturbances, patterned or non-patterned disturbances, unwanted signal characteristics, Inter Symbol Interference (ISI), electric noise, electric interference, white noise, non-white noise, signal distortions, shot noise, thermal noise, flicker noise, "pink" noise, burst noise, avalanche noise, noise or interference produced by components internal to a device attempting to receive a signal, noise or interference produced by co-existing components of a device attempting to receive a signal, noise or interference produced by components or units external to a device attempting to receive a signal, random noise, pseudo-random noise, non-random noise, patterned or non-patterned interference, or the like.

The term "mitigation" (e.g., of interference or noise) as used herein includes, for example, reduction, decrease, lessening, elimination, removal and/or avoidance.

The terms "television signal(s)" or "digital television signals" as used herein include, for example, signals carrying television information, signals carrying audio/video information, Digital Television (DTV) signals, digital broadcast signals, Digital Terrestrial Television (DTTV) signals, signals in accordance with one or more Advanced Television Systems Committee (ATSC) standards, Vestigial SideBand (VSB) digital television signals (e.g., 8-VSB signals), Coded ODFM (COFDM) television signals, Digital Video Broadcasting-Terrestrial (DVB-T) signals, DVB-T2 signals, Integrated Services Digital Broadcasting (ISDB) signals, digital television signals carrying MPEG-2 audio/video, digital television signals carrying MPEG-4 audio/video or H.264 audio/video or MPEG-4 part 10 audio/video or MPEG-4 Advanced Video Coding (AVC) audio/video, Digital Multimedia Broadcasting (DMB) signals, DMB-Handheld (DMB-H) signals, High Definition Television (HDTV) signals, progressive scan digital television signals (e.g., 720p), interlaced digital television signals (e.g., 1080i), television signals transferred or received through a satellite or a dish, television signals transferred or received through the atmosphere or through cables, signals that include (in whole or in part) non-television data (e.g., radio and/or data services) in addition to or instead of digital television data, or the like.

Among the television signals that may be utilized for video is the recent China digital television standard. The standard is designated number GB20600-2006 of the SAC (Standardization Administration of China), and is entitled "Framing Structure, Channel Coding and Modulation for Digital Television Terrestrial Broadcasting System", issued Aug. 18, 2006. The standard may also be referred to as DMB-T (Digital Multimedia Broadcasting-Terrestrial) or DMB-T/H (Digital Multimedia Broadcasting Terrestrial/Handheld). This standard will generally be referred to herein as "DMB-T".

Now turning to the figures, FIG. 1 illustrates an electronic system 100 that incorporates multiple radios in a common platform to allow communication with other over-the-air communication systems, the platform including a tuner 120 comprising a single local oscillator (LO) or phase lock loop (PLL) configured to provide a plurality of commutating frequencies according to some embodiments of the invention. In another embodiment of the invention (not shown), the electronic system 100 is a wired cable television receiver system, satellite aerial, or set-top box that is configured to provide a plurality of commutating frequencies from the tuner 120 comprising a single local oscillator (LO) or phase lock loop (PLL).

The electronic system 100 may operate in a number of networks such as, for example, Digital Television (DTV), digital broadcast, Digital Terrestrial Television (DTTV), signals in accordance with one or more Advanced Television Systems Committee (ATSC) standards, Vestigial SideBand (VSB) digital television (e.g., 8-VSB signals), Digital Video Broadcasting-Handheld (DVB-H) that brings broadcast services to handheld receivers as adopted in the ETSI standard EN 302 304; Digital Multimedia Broadcasting (DMB); Digital Video Broadcasting-Terrestrial (DVB-T); the Integrated Services Digital Broadcasting-Terrestrial (ISDB-T) in Japan; or Wireless Fidelity (Wi-Fi) that provides the underlying technology of Wireless Local Area Network (WLAN) based on the IEEE 802.11n specifications, although the present invention is not limited to operate in only these networks. Thus, the radio subsystems co-located in electronic system 100 provide the capability of communicating in an RF/location space with other devices in one or more networks.

The simplistic embodiment illustrates an RF transceiver 110 with one or more antenna(s) 105 that may receive host transmissions such as WWAN, WiFi, etc., that are coupled to a transceiver 115 to accommodate modulation/demodulation. The antennas 105 also receive transmission for a tuner 120 to receive "data bits" used to make a TV picture and sound through Digital television (DTV) broadcasting technology. Alternately, the antenna 105 may be a wired input to deliver signals to the tuner 120 (not shown).

In one embodiment, the tuner 120 converts a selected channel to a predetermined intermediate frequency (IF) output, which may be further amplified and filtered either internally of the tuner or externally, such as in the RF transceiver 110. Each antenna 105 may comprise one or more directional or omnidirectional antennas, including, for example, dipole antennas, monopole antennas, patch antennas, loop antennas, microstrip antennas, or other types of antennas suitable for transmission of RF signals. In some embodiments, instead of two or more antennas, a single antenna with multiple apertures may be used. In these embodiments, each aperture may be considered a separate antenna. In some multiple-input, multiple-output (MIMO) embodiments, the RF transceiver 110 may use two or more of antennas 105 that may be effectively separated to take advantage of spatial diversity and the different channel characteristics that may result between each of the antennas 105 and one or more host transmission source(s) transmitting a transport stream.

Appropriate to received MPEG-2 transport streams and the different technical constraints of the received data, a demodulation scheme may be selected to provide the demodulated signals to a processor 140. By way of example, the receiver may include OFDM blocks with pilot signals and the digital demodulation schemes may employ QPSK, DQPSK, 16QAM and 64QAM, among other schemes. The transceiver 115 and tuner 120 may be embedded with the processor 140 as a mixed-mode integrated circuit where baseband and applications processing functions may be handled by an embedded first core 130 and an embedded second core 135.

The processor 140 may transfer data through a memory interface 145 to memory storage in a system memory 150 comprising one or more of a volatile and/or nonvolatile memory for storage. For example, nonvolatile memory may include one or more of the following: read-only memory (ROM), programmable ROM (PROM), erasable PROM (EPROM), electrically EPROM (EEPROM), a disk drive or solid state drive (e.g., 228), a floppy disk, a compact disk ROM (CD-ROM), a digital versatile disk (DVD), flash memory, a magneto-optical disk, or other types of nonvolatile machine-readable media capable of storing electronic data including instructions. The processor 140 as illustrated in this embodiment provides two core processors or central processing unit(s). The processor 140 may be any type of processor such as a general purpose processor, a network processor (which may process data communicated over a computer network), etc. (including a reduced instruction set computer (RISC) processor, an application specific integrated circuit (ASIC), or a complex instruction set computer (CISC)). In alternate embodiments, the processor 140 may have a single or quad core design. The processor 140 with a multiple core design may integrate different types of processor cores on the same integrated circuit (IC) die. Also, the processor 140 with a multiple core design may be implemented as symmetrical or asymmetrical multiprocessors.

Figure 2:
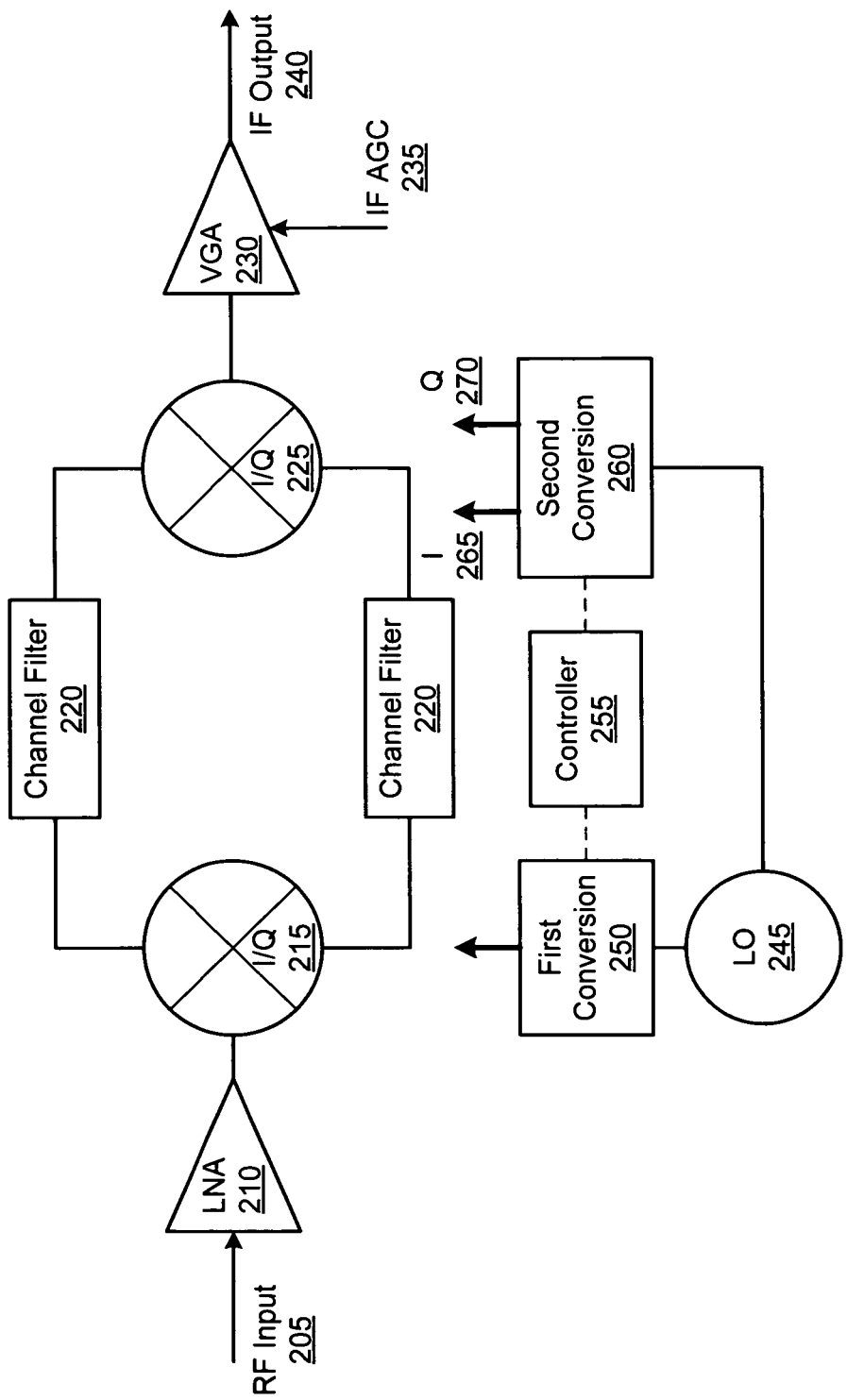
FIG. 2 is a block diagram of a tuner with multiple commutating frequencies from a single LO in accordance with some embodiments of the invention.

FIG. 2 is a block diagram of a portion of the tuner 120 of FIG. 1 configured to provide a variable intermediate frequency from a common source, or oscillator such as a local oscillator (LO) or variable frequency oscillator, in accordance with some embodiments of the invention. A low noise amplifier (LNA) 210 which provides controlled input impedance at the input is provided to amplify broadband signals from an RF input 205 which may include one or more of the cable, terrestrial, and wireless television signals disclosed herein. The amplified signals are passed to a first mixer 215, or I/Q mixer in this embodiment. The first mixer 215 receives and combines an input signal or RF signal from the LNA 210 with a frequency signal from a first conversion stage 250 to provide a zero intermediate frequency (ZIF) signal. In another embodiment, the first mixer 215 combines an input signal from the LNA 210 with a frequency signal from the first conversion stage 250 to provide an intermediate frequency signal (IF).

The first conversion stage 250 scales the frequency signal from the local oscillator 245 by a first conversion ratio to adjust the frequency signal from the local oscillator 245 provided to the first mixer 215. In another embodiment, a variable frequency oscillator is used as the common source instead of the local oscillator 245. The ZIF or IF signal from the first mixer 215, including an in-phase (I) component and a Quadrature (Q) component is filtered using the channel filters 220 configured to pass one or more desired frequencies or frequency bands while blocking others. The channel filters 220 filter a mixed component of the first commutating frequency, which is an output of the first conversion stage 250 in this embodiment, and an output frequency of the first mixer 215. The channel filters 220 in this embodiment are positioned between the first mixer 215 and a second mixer 225.

The second mixer 225 is provided to receive and upconvert the filtered ZIF or IF signal from the channel filters 220 with a frequency signal from the local oscillator 245 and an I component 265 and a Q component 270 of a second commutating frequency from the second conversion stage 260. The second conversion stage 260 scales the frequency signal from the local oscillator 245, the common source to the first conversion stage 250 and the second conversion stage 260, by a second conversion ratio to adjust the frequency signal from the local oscillator 245 that is provided to the second mixer 225. In an alternate embodiment, the tuner 120 of FIG. 1 is configured to provide the IF output 240 using a variable intermediate frequency from the common source involving two or more stages of conversion, such as the first conversion 250 and the second conversion 260, without separating the ZIF or IF signal into I and Q components.

The second mixer 225 upconverts the ZIF or IF signal from the first mixer 215 and converts the whole of the signal band limited by the channel filters 220 to an intermediate frequency (IF) that is higher than a signal band of the IF or ZIF signal from the first mixer 215. The intermediate frequency signal output from the second mixer 225 is amplified by a variable gain amplifier (VGA) 230 that receives an IF automatic gain control signal (AGC) 235 for controlling a gain of the VGA 230 so as to reduce the range of IF output 240 signals supplied to a downstream component or system such as a demodulator (not shown), wherein the demodulator may be configured to provide frequency trimming compensation. The gain from the VGA 230 is controlled externally by means of the IF AGC signal 235 based on signal level measurement downstream of the IF output 240, or on the performance of a downstream demodulator. In an alternate embodiment (not shown), the first mixer 215 outputs a IF signal while the second mixer 225 outputs a ZIF signal.

The first conversion stage 250 and the second conversion stage 260 are both tuned or scaled by scaling ratios using a controller 255. Two frequency conversion stages, the first conversion stage 250 and the second conversion stage 260, are illustrated and described in FIG. 2, however the embodiment is not so limited. A plurality of frequency conversion stages including three or more frequency conversion stages may be tuned or scaled by scaling ratios using the controller 255. The controller 255 may be the processor 140 of FIG. 1 or a separate controller in the form of a general purpose processor, a network processor (which may process data communicated over a computer network), etc. (including a reduced instruction set computer (RISC) processor, an application specific integrated circuit (ASIC), or a complex instruction set computer (CISC)).

As an example, the LO 245 may be tunable in a range between 3 and 6 gigahertz (GHz), a first commutating frequency (downconversion) from the first mixer 215 may be delivered between 50 and 1,000 megahertz (MHz), and a second commutating frequency (upconversion) from the second mixer 225 may be around 12 MHz. To accommodate a channel request or requirement, a first conversion stage comprising the first mixer 215 and the first conversion stage 250 are configured to tune a desired channel to a ZIF signal. If the desired channel is 501 MHz, then first conversion 250 may be set to 6 and the LO 245 is tuned to 3006 MHz. A second conversion stage comprising the second mixer 225 and the second conversion stage 260 is configured for upconversion to provide an IF output of 12 MHz. To accommodate the request, given the LO 245 is tuned to 3006 MHz, then the second conversion stage may be set to 251 to deliver the IF output 240 at 11.98 MHz, or about 12 MHz.

As an alternative, first conversion 250 may be set to 8 with the LO 245 tuned to 4008 MHz to provide the desired channel at 501 MHz. It follows that to provide the IF output at 12 MHz that second conversion 260 would be set to 334 to ratio the 4008 MHz signal from the LO 245 down to 12 MHz. As another example, first conversion 250 may be set to 10 while tuning the LO 245 to 5010 MHz to provide the desired channel at 501 MHz. It follows that to provide the IF output at 12 MHz that second conversion 260 would be set to 418 to ratio the 5010 MHz signal from the LO 245 down to about 12 MHz. In each example, the LO 245 is scaled by the first conversion stage 250 and the second conversion stage 260 using scaling factors to provide a subharmonic frequency of the LO 245 frequency. Residual tuning error between the desired signal frequency at the first conversion stage or the second conversion stage is removed by digital downconversion in a demodulator (not shown) downstream from the VGA 230.

A further embodiment consistent with FIG. 2 is to add a fixed output division ratio in the second conversion stage. For example, the fixed output division ratio may be set to 4 as part of the second conversion stage 260. If the desired channel is 501 MHz, first conversion 250 is set to 6 and the LO 245 is tuned to 3006 MHz. For this condition, upconversion in the second stage needs to be set at approximately 12 MHz. If the fixed output division ratio is set to 4, then second conversion may set a product of the fixed output division ratio, which is 4, by 63 to ratio the LO 245 signal frequency of 3006 MHz by 252 to provide the IF output 240 at 11.93 MHz, or about 12 MHz. The second conversion stage 260 may be preceded by a fixed divider having a fixed conversion ratio, such as a prescale 320 as illustrated in FIG. 3 between the LO 245 and the second conversion stage 260, to provide similar functionality.

Figure 3:
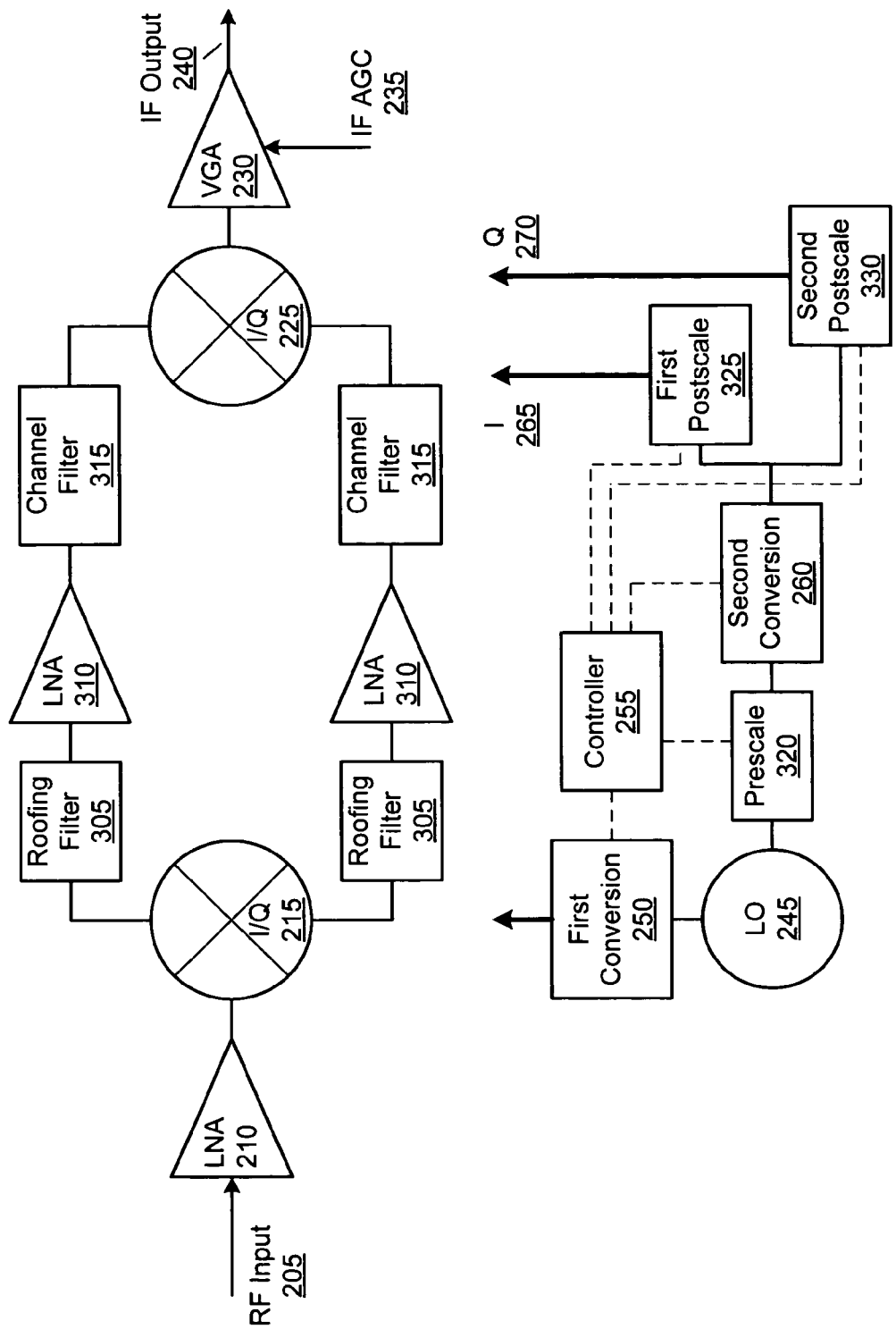
FIG. 3 is another block diagram of a tuner with multiple commutating frequencies from a single LO in accordance with some embodiments of the invention.

FIG. 3 is another block diagram of a portion of the tuner 120 configured to generate a variable intermediate frequency from a single LO in accordance with some embodiments of the invention. As described earlier with reference to FIG. 2, a low noise amplifier (LNA) 210 amplifies broadband signals from an RF input 205. The input signals may include one or more of the cable, terrestrial, and wireless television signals disclosed herein. The amplified signals from the LNA 210 are provided to the first mixer 215. The first mixer 215 receives and combines the amplified RF signal from the LNA 210 with a frequency signal from a local oscillator 245 and a first conversion stage 250 to provide a zero intermediate frequency (ZIF) signal. In this embodiment, roofing filters 305 are located between the first mixer 215 and inter-filter LNAs 310, wherein the roofing filters 305 are configured to reduce a passband of the ZIF so that overloading and/or distortion by the inter-filter LNA 310 and the second mixer 225 is reduced. The ZIF signal from the first mixer 215, including an in-phase (I) component and a Quadrature (Q) component is filtered using the channel filters 315 configured to pass one or more desired frequencies or frequency bands while blocking others.

A fixed divider is provided in FIG. 3, illustrated as a prescale 320 component, to reduce an operating frequency of second conversion 260 and to reduce related power consumption. Also, a first postscale 325 component and a second postscale 330 component is provided to provide the in-phase component I 265 and the quadrature phase component 270. To build upon the example provided earlier wherein the desired channel is 501 MHz, first conversion 250 is set to 6, and the LO 245 is tuned to 3006 MHz, then upconversion in the second stage needs to be about 12 MHz. Further, if prescale 320 ratio is set to 4, first postscale 325 ratio is 6, and the second postscale 330 ratio is 6, the second conversion 260 ratio should be set to 10 to provide IF output 240 at 12.53 MHz, or about 12 MHz.

Figure 4:
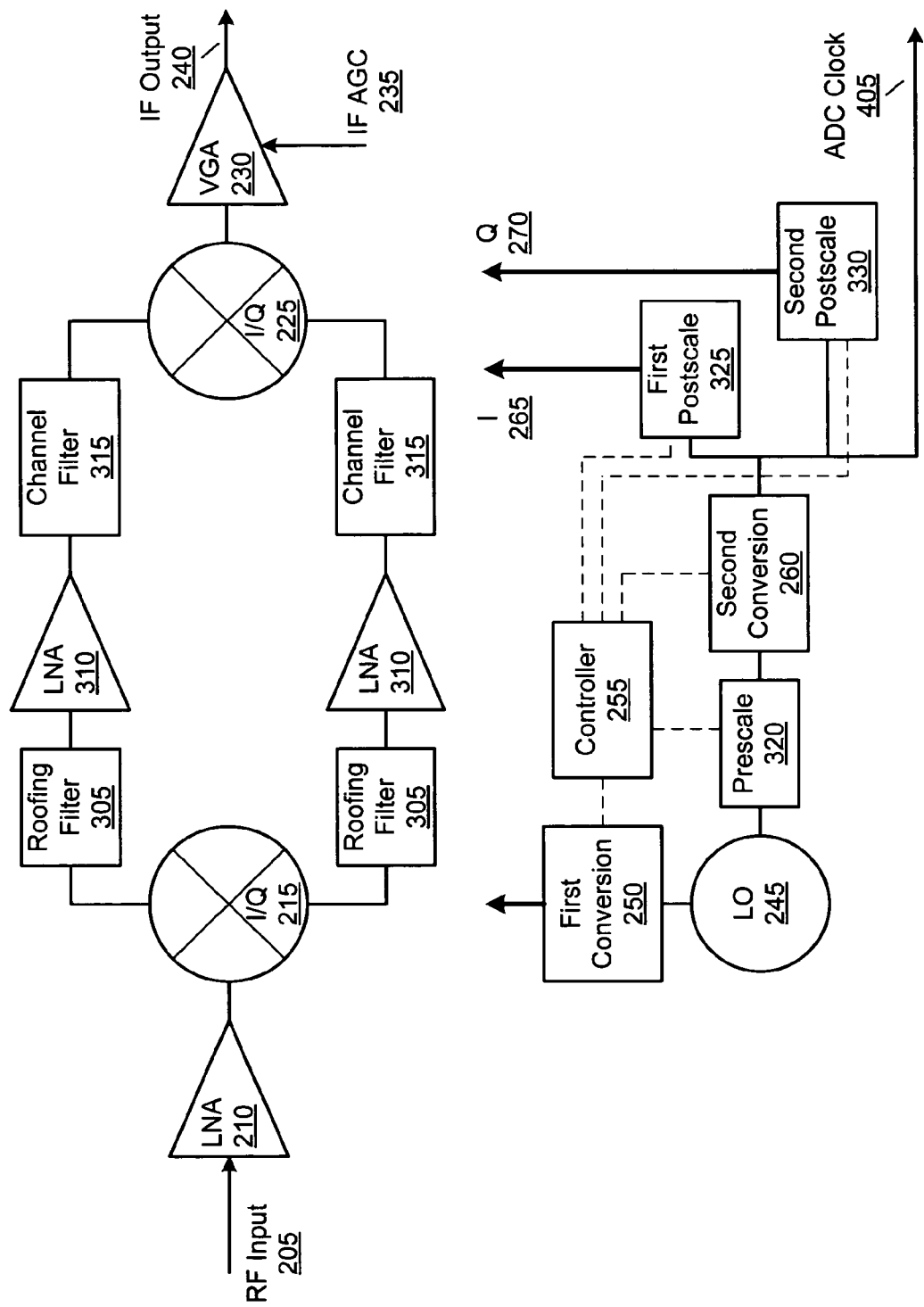
FIG. 4 is another block diagram of a tuner with multiple commutating frequencies from a single LO in accordance with some embodiments of the invention.

The first conversion stage 250, the second conversion stage 260, the prescale 320 component, the first postscale 325 component, and the second postscale 330 component may be set within a range of integer values depending on design considerations and may be controlled by the controller 255 and/or may be dependent on component hardware design. In each embodiment, the IF output 240 provided using a single LO 245, the first conversion stage, and the second conversion stage, the second conversion stage ratio may be derived to deliver the IF output 240 within a predetermined frequency window. Differential between a desired IF output frequency and the IF output 240 may be removed in a downconversion process in a downstream demodulator (not shown) using frequency trimming compensation. An output of the second conversion 260 may be used to provide an analog to digital conversion (ADC) clock 405 signal, as illustrated in FIG. 4 for a downstream demodulator.

Figure 5:
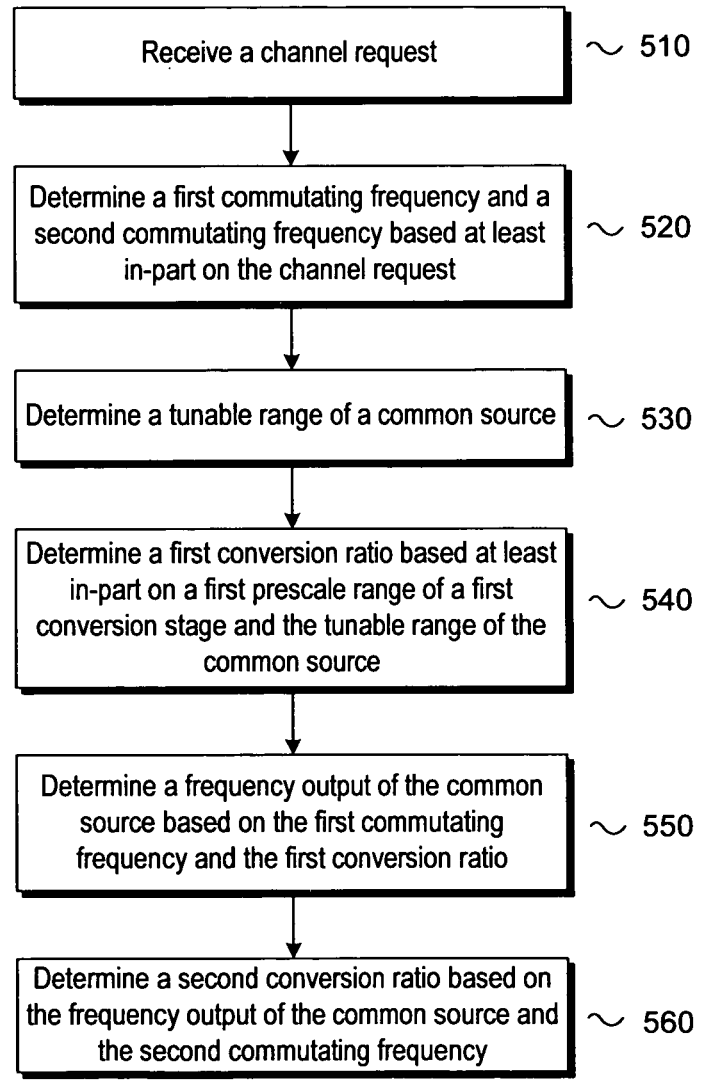
FIG. 5 is a flowchart that describes an embodiment of a method for efficient implementation of tuners.

FIG. 5 is a flowchart that describes an embodiment of a method for an efficient implementation of the tuner 120, as illustrated in the embodiments of FIGS. 1 through 4, wherein the tuner 120 is configured to deliver multiple commutating frequencies from a common source. In element 510, a channel request is provided. A first commutating frequency from the first conversion stage 250 and a second commutating frequency from the second conversion stage 260 is determined in element 520 based at least in part on the channel request. In another embodiment, the first commutating frequency, the second commutating frequency, a scaling factor of the first conversion stage 250 and a scaling factor of the second conversion stage 260 may be further dependent on the IF output 240 and a signal frequency between the first mixer 215 and the second mixer 225.

In element 530, a tunable range of a common source, such as the local oscillator 245, is determined if the tunable range is not already known. A first conversion ratio is determined in element 540 based at least in part on a first prescale range of the first conversion stage 250 and the tunable range of the local oscillator 245, or common source. In element 550, a frequency output of the common source is determined based on the first commutating frequency and the first conversion ratio. A second conversion ratio for a second conversion stage 260 based on the output frequency of the common source and the second commutating frequency is then determined in element 560. The first conversion stage 250 and/or the second conversion stage 260 may convert with or without in-phase and quadrature components in further embodiments.

Figure 6:
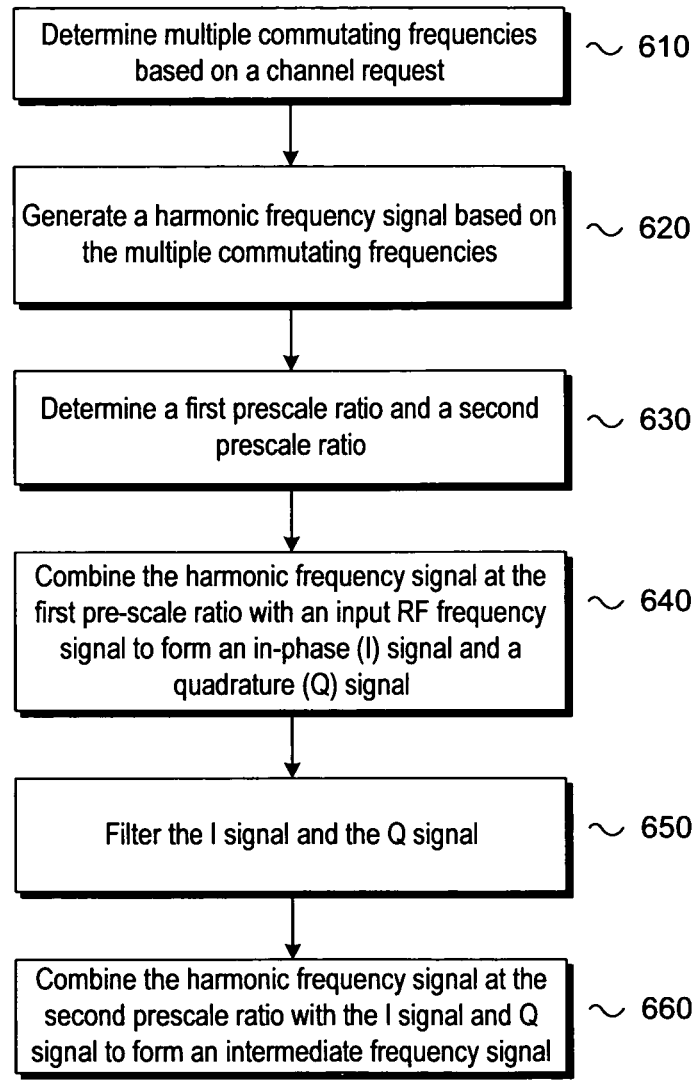
FIG. 6 is a flowchart that describes another embodiment of a method for efficient implementation of tuners.

FIG. 6 is a flowchart that describes an alternate embodiment of a method for an efficient implementation the tuner 120, as illustrated in the embodiments of FIGS. 1 through 4, wherein the tuner 120 is configured to deliver multiple commutating frequencies from a common source. In element 610, multiple commutating frequencies are determined based on a channel request. A frequency is generated in element 620 based at least upon the multiple commutating frequencies, wherein the frequency is a harmonic frequency of each of the commutating frequencies, or an integer multiple or ratio of each of the commutating frequencies. A first prescale ratio and a second prescale ratio is determined in element 630. The harmonic frequency signal at the first prescale ratio is combined with an input RF frequency signal to form an in-phase (I) signal and a quadrature (Q) signal in element 640. The I signal and the Q signal is filtered in element 650 and the harmonic frequency signal at the second prescale ratio is combined with the I signal and the Q signal in element 660 to form an intermediate frequency signal.

Embodiments may be described herein with reference to data such as instructions, functions, procedures, data structures, application programs, configuration settings, etc. For purposes of this disclosure, the term "program" covers a broad range of software components and constructs, including applications, drivers, processes, routines, methods, modules, and subprograms. The term "program" can be used to refer to a complete compilation unit (i.e., a set of instructions that can be compiled independently), a collection of compilation units, or a portion of a compilation unit. Thus, the term "program" may be used to refer to any collection of instructions which, when executed by the electronic system 100, provides multiple commutating frequencies from a common source. The programs in the electronic system 100 may be considered components of a software environment.

The operation discussed herein may be generally facilitated via execution of appropriate firmware or software embodied as code instructions on the controller 255 of the electronic system 100, as applicable. Thus, embodiments of the invention may include sets of instructions executed on some form of processing core or otherwise implemented or realized upon or within a machine-readable medium. A machine-readable medium includes any mechanism for storing or transmitting information in a form readable by a machine (e.g., a computer). For example, a machine-readable medium can include an article of manufacture such as a read only memory (ROM); a random access memory (RAM); a magnetic disk storage media; an optical storage media; and a flash memory device, etc. In addition, a machine-readable medium may include propagated signals such as electrical, optical, acoustical or other form of propagated signals (e.g., carrier waves, infrared signals, digital signals, etc.).

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A method for generating multiple independent commutating frequencies from a common source, comprising:
   receiving a channel request;
   determining a first commutating frequency and a second commutating frequency based at least in-part upon the channel request;
   determining a tunable range of the common source;
   determining a first conversion ratio based at least in-part on a first prescale range of a first conversion stage and the tunable range of the common source;
   determining a frequency output of the common source based on the first commutating frequency and the first conversion ratio;
   determining a second conversion ratio based on the frequency output of the common source and the second commutating frequency; and
   scaling an in-phase component and a quadrature component of the frequency output of the common source by a first postscale stage and a second postscale stage.

2. The method of claim 1, further including filtering a mixed component of the first commutating frequency and an input frequency to the first mixer with a channel filter positioned between the first mixer and a second mixer.

3. The method of claim 1, wherein the channel request is derived from a television signal.

4. The method of claim 1, wherein the frequency output of the common source is generated by a local oscillator.

5. The method of claim 1, further including determining the second conversion ratio based on a fixed conversion ratio of a fixed divider, the frequency output of the common source, and the second commutating frequency.

6. The method of claim 1, further including filtering a mixed component of the first commutating frequency and an input frequency to a first mixer with a roofing filter.

* * * * *